US010330723B2

United States Patent
Wang

(10) Patent No.: US 10,330,723 B2
(45) Date of Patent: Jun. 25, 2019

(54) OPERATION VOLTAGE TESTING CIRCUIT AND METHOD

(71) Applicant: Realtek Semiconductor Corporation, Hsinchu (TW)

(72) Inventor: Shih-Wei Wang, Hualien County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 22 days.

(21) Appl. No.: 15/339,901

(22) Filed: Oct. 31, 2016

(65) Prior Publication Data
US 2018/0003763 A1    Jan. 4, 2018

(30) Foreign Application Priority Data

Jul. 1, 2016 (TW) ............................... 105120950 A

(51) Int. Cl.
G01R 31/26 (2014.01)
H04B 10/69 (2013.01)
G05F 1/10 (2006.01)

(52) U.S. Cl.
CPC ........... *G01R 31/2635* (2013.01); *G05F 1/10* (2013.01); *H04B 10/6911* (2013.01)

(58) Field of Classification Search
CPC ... G01R 31/2635; G01R 31/2632; G05F 1/10; H04B 10/6911; H01S 5/06808; H01L 31/20207

See application file for complete search history.

(56) References Cited

U.S. PATENT DOCUMENTS

| 7,103,288 B2* | 9/2006 | Wang | H01L 31/02027 250/214 R |
| 8,837,539 B1* | 9/2014 | Sun | H01S 5/06808 372/29.01 |
| 2002/0195545 A1* | 12/2002 | Nishimura | H01L 27/14643 250/208.1 |
| 2003/0122533 A1* | 7/2003 | Prescott | G05F 3/205 323/313 |
| 2007/0075215 A1* | 4/2007 | Giovannini | H04B 10/66 250/201.1 |

(Continued)

FOREIGN PATENT DOCUMENTS

TW    201526506 A    7/2015
TW    201547163 A    12/2015

*Primary Examiner* — Son T Le
*Assistant Examiner* — Dustin R Dickinson
(74) *Attorney, Agent, or Firm* — CKC & Partners Co., LLC

(57) ABSTRACT

An operation voltage testing circuit includes a voltage generating circuit, a current-to-voltage conversion circuit, and a processing circuit. The voltage generating circuit is configured to generate a first voltage signal according to a first current signal, such that a photoelectric conversion unit generates a second current signal corresponding to the first voltage signal. The current-to-voltage conversion circuit is configured to generate a second voltage signal corresponding to the second current signal. The processing circuit is configured to receive the second voltage signal and to selectively adjust and output the first current signal according to the second voltage signal and a threshold value, such that the voltage generating circuit selectively adjusts the first voltage signal according to the first current signal.

17 Claims, 4 Drawing Sheets

(56) References Cited

U.S. PATENT DOCUMENTS

| | | | |
|---|---|---|---|
| 2009/0194675 A1* | 8/2009 | Ichino | H04B 10/6911 250/214 R |
| 2011/0085576 A1* | 4/2011 | Crawford | H05B 33/0818 372/38.07 |
| 2011/0158656 A1* | 6/2011 | Vieira | H04B 10/6911 398/202 |
| 2016/0273959 A1* | 9/2016 | Wang | H01L 31/02027 |

* cited by examiner

OPERATION VOLTAGE TESTING CIRCUIT AND METHOD

RELATED APPLICATIONS

This application claims priority to Taiwanese Application Serial Number 105120950, filed Jul. 1, 2016, which is herein incorporated by reference.

BACKGROUND

Technical Field

The present disclosure relates to a circuit technology. More particularly, the present disclosure relates to an operation voltage testing circuit and an operation voltage testing method.

Description of Related Art

A photoelectric conversion element, such as an avalanche photodiode, is an element to convert an optical signal to an electrical signal. The photoelectric conversion element is applied to many fields, such as fiber-optic communication. Taking the avalanche photodiode for example, an operation voltage of the avalanche photodiode changes with a wide variety of factors. In this regard, it is very important to effectively and rapidly find out the operation voltage of the photoelectric conversion element, like the avalanche photodiode.

SUMMARY

One embodiment of the present disclosure is related to an operation voltage testing circuit. The operation voltage testing circuit includes a voltage generating circuit, a current-to-voltage conversion circuit, and a processing circuit. The voltage generating circuit is configured to generate a first voltage signal according to a first current signal, such that a photoelectric conversion unit generates a second current signal corresponding to the first voltage signal. The current-to-voltage conversion circuit is configured to generate a second voltage signal corresponding to the second current signal. The processing circuit is configured to receive the second voltage signal and to selectively adjust and output the first current signal according to the second voltage signal and a threshold value, such that the voltage generating circuit selectively adjusts the first voltage signal according to the first current signal.

One embodiment of the present disclosure is related to an operation voltage testing method. The operation voltage testing method includes: generating a first voltage signal according to a first current signal by a voltage generating circuit, such that a photoelectric conversion unit generates a second current signal corresponding to the first voltage signal; generating a second voltage signal corresponding to the second current signal by a current-to-voltage conversion circuit; and receiving the second voltage signal, and selectively adjusting and outputting the first current signal according to the second voltage signal and a threshold value by a processing circuit, such that the voltage generating circuit selectively adjusts the first voltage signal according to the first current signal.

One embodiment of the present disclosure is related to an operation voltage testing circuit. The operation voltage testing circuit includes a processing circuit and a voltage generating circuit. The processing circuit is configured to generate a first current circuit. The voltage generating circuit is configured to generate a first voltage signal with a first voltage level according to the first current signal, such that a photoelectric conversion unit generates a second current signal corresponding to the first voltage signal. The processing circuit is further configured to adjust and output the first current signal when the second current signal is smaller than a current signal outputted by the photoelectric conversion unit under a condition that the photoelectric conversion unit operates under an operation voltage, such that the voltage generating circuit generates the first voltage signal with a second voltage level. The second voltage level is higher that the first voltage level.

As the above embodiments, the operation voltage testing circuit of the present disclosure adjusts the first voltage signal as the operation voltage of the photoelectric conversion unit by the processing circuit, such that the operation voltage of the photoelectric conversion unit is found out effectively and rapidly.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
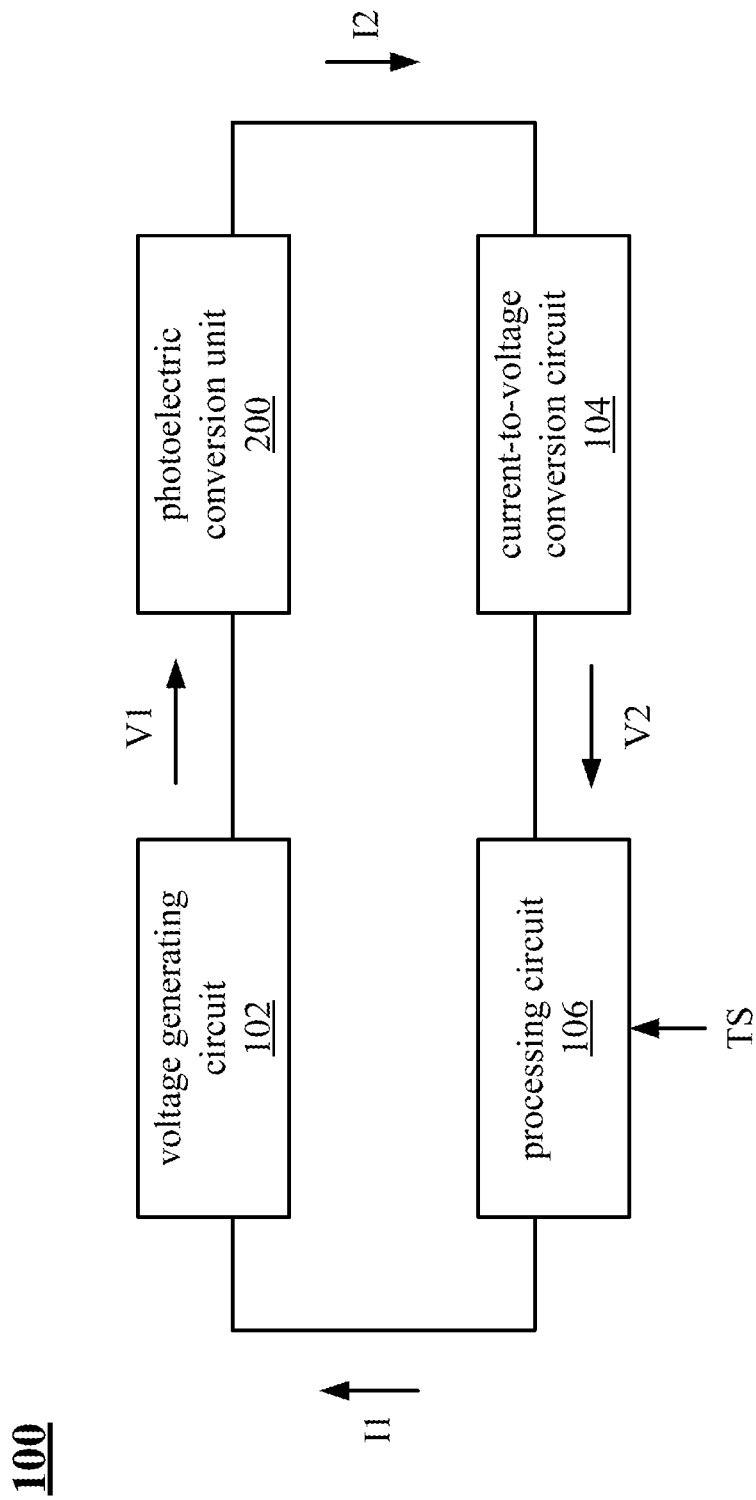
FIG. 1 is a schematic diagram illustrating an operation voltage testing circuit according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

FIG. 1 is a schematic diagram illustrating an operation voltage testing circuit 100 according to some embodiments of the present disclosure. As illustrated in FIG. 1, in some embodiments, the operation voltage testing circuit 100 includes a voltage generating circuit 102, a current-to-voltage conversion circuit 104, and a processing circuit 106. In some further embodiments, the aforementioned circuits may be integrated and disposed in an integrated circuit (IC).

A photoelectric conversion unit 200 is configured to convert an optical signal to a corresponding electrical signal. In some embodiments, the photoelectric conversion unit 200 is, for example, an avalanche photodiode (APD), but is not limited thereof. Various photoelectric conversion elements configured to implement the photoelectric conversion unit 200 are within the contemplated scope of the present disclosure.

The operation voltage testing circuit 100 is configured to find out an operation voltage of the photoelectric conversion unit 200 under a certain temperature. Further, the operation voltage of the photoelectric conversion unit 200 under the certain temperature is effectively and rapidly found through the operation voltage testing circuit 100.

As illustrated in FIG. 1, the voltage generating circuit 102 receives a first current signal I1 from the processing circuit 106, and generates a first voltage signal V1 according to the first current signal I1. The photoelectric conversion unit 200 receives the first voltage signal V1. Under this condition, the photoelectric conversion unit 200 is reversely biased and generates a second current signal I2 according to the first voltage signal V1, to perform a process of optical-to-electrical conversion. Then, the current-to-voltage conversion circuit 104 receives the second current signal I2, and generates a second voltage signal V2 according to the second current signal I2. Then, the processing circuit 106 receives the second voltage signal V2, and selectively adjusts and outputs the first current signal I1 according to the second voltage signal V2 and a threshold value TS, such that the voltage generating circuit 102 selectively adjusts the first voltage signal V1 generated by the voltage generating circuit 102 according to the first current signal I1.

The threshold value TS is corresponding to the second current signal I2 generated under a condition that the photoelectric conversion unit 200 operates under its operation voltage. Since the second voltage signal V2 is converted according to the second current signal I2, the threshold value TS is also corresponding to the second voltage signal V2 generated under the condition that the photoelectric conversion unit 200 operates under its operation voltage. In other words, when the second voltage signal V2 is corresponding to the threshold value TS, the photoelectric conversion unit 200 operates under its operation voltage. Under this condition, the first voltage signal V1 is the operation voltage of the photoelectric conversion unit 200. On the contrary, when the second voltage signal V2 is not corresponding to the threshold value TS, the photoelectric conversion unit 200 does not operate under its operation voltage. Under this condition, the first voltage signal V1 is not the operation voltage of the photoelectric conversion unit 200.

In some embodiments, since it is known of a range of a current signal generated by the photoelectric conversion unit 200 when the photoelectric conversion unit 200 operates under its operation voltage, the threshold value TS is able to be preset.

In brief, in the operation voltage testing circuit 100, the processing circuit 106 is configured to control the voltage generating circuit 102 to adjust the first voltage signal V1, to adjust the first voltage signal V1 as the operation voltage of the photoelectric conversion unit 200.

Figure 2:
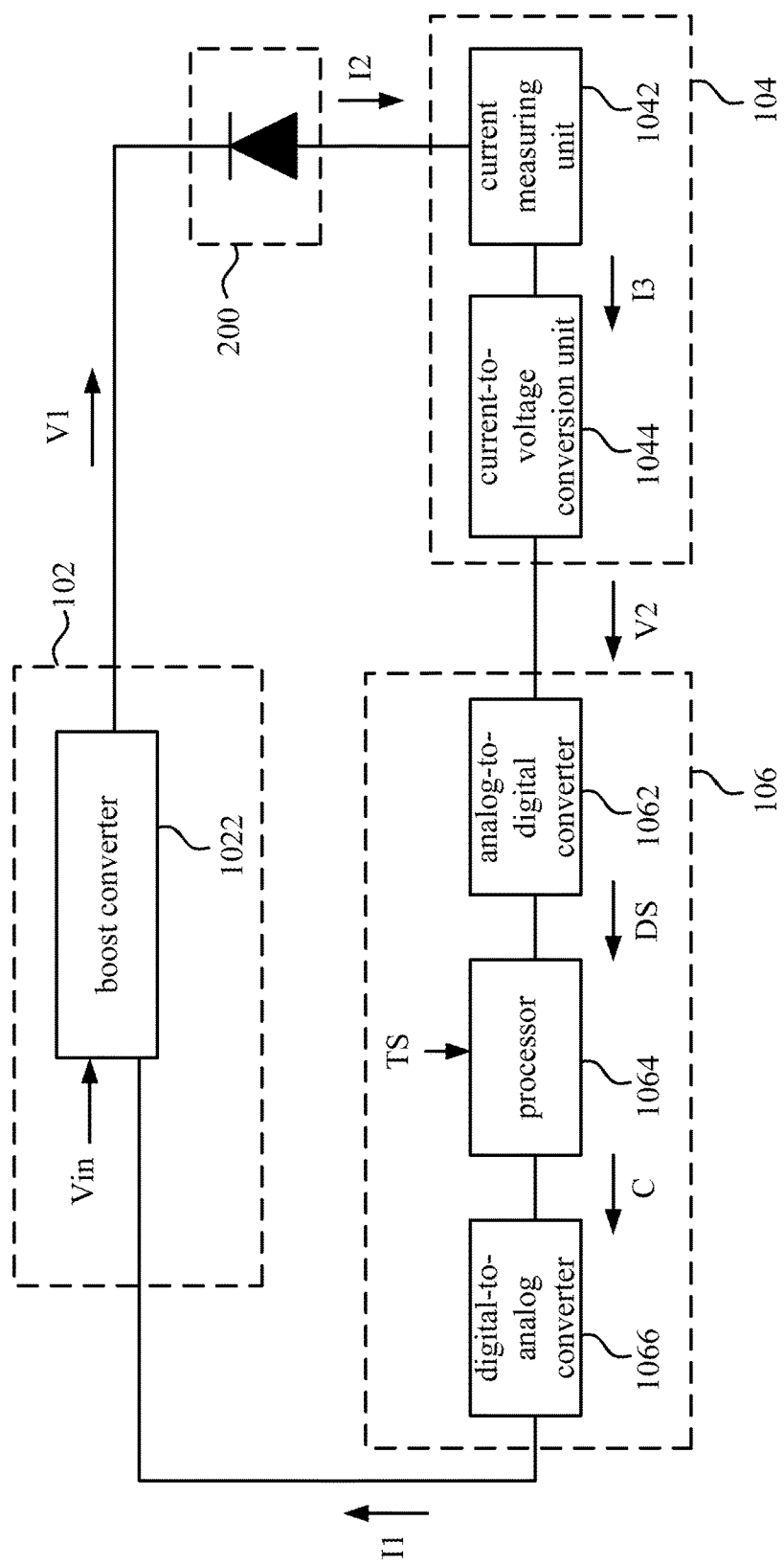
FIG. 2 is a functional block diagram illustrating the operation voltage testing circuit in FIG. 1 according to some embodiments of the present disclosure.

FIG. 2 is a functional block diagram illustrating the operation voltage testing circuit 100 in FIG. 1 according to some embodiments of the present disclosure. As illustrated in FIG. 2, the voltage generating circuit 102 includes a boost converter 1022. The current-to-voltage conversion circuit 104 includes a current measuring unit 1042 and a current-voltage conversion unit 1044. The current measuring unit 1042 is, for example, a current measuring device. The current-to-voltage conversion unit 1044 is, for example, one current-to-voltage converter of various current-to-voltage converters. The processing circuit 106 includes an analog-to-digital converter 1062, a processor 1064 (such as a micro processor), and a digital-to-analog converter 1066.

First, the boost converter 1022 operates under a working voltage Vin, receives the first current signal I1, and generates the first voltage signal V1 corresponding to the first current signal I1. Under this condition, the first voltage signal V1 has a first voltage level (such as a low voltage level). The photoelectric conversion unit 200 receives the first voltage signal V1 and generates the second current signal I2 corresponding to the first voltage signal V1. The current measuring unit 1042 is configured to measure the second current signal I2 and generates a third current signal I3 corresponding to the second current signal I2. In some embodiments, the third current signal I3 is equal to or smaller than the second current signal I2. For example, a current value of the third current signal I3 may be equal to a current value of the second current signal I2 or equal to one-tenth of the current value of the second current signal I2. When the third current signal I3 is smaller than the second current signal I2, the effect of saving power may be achieved.

Then, the current-to-voltage conversion unit 1044 receives the third current signal I3, and converts the third current signal I3 to the second voltage signal V2. Then, the analog-to-digital converter 1062 receives the second voltage signal V2, and converts the second voltage signal V2 to a digital signal DS. Then, the processor 1064 compares the digital signal DS with the threshold value TS.

When the processor 1064 determines that the digital signal DS is smaller than the threshold value TS, the second current signal I2 is smaller than the current signal outputted by the photoelectric conversion unit 200 which operates under its operation voltage. Under this condition, the digital-to-analog converter 1066 adjusts the first current signal I1 according to a control signal C from the processor 1064. Then, the voltage generating circuit 102 receives the adjusted first current signal I1 and generates the corresponding first voltage signal V1. For example, the first voltage signal V1 is adjusted from the first voltage level to a second voltage level (such as high voltage level). The second voltage level is higher than the aforementioned first voltage level. How the first voltage signal V1 is adjusted from the first voltage level to the second voltage level is described later.

Then, the photoelectric conversion unit 200 generates the second current signal I2 corresponding to the first voltage signal V1 with the second voltage level. Then, the current measuring unit 1042 generates a corresponding third current signal I3. Then, the current-to-voltage conversion unit 1044 generates a corresponding second voltage signal V2. The analog-to-digital converter 1062 converts the new second voltage signal V2 to a new digital value. The processor 1064 compares the new digital signal with the threshold value TS. The operations above continues till the processor 1064 determines that the digital value is satisfied to the threshold value TS.

When the processor 1064 determines that the digital signal DS is satisfied to the threshold value TS, the digital-to-analog converter 1066 maintains the first current signal I1, such that the voltage generating circuit 102 continues to generate the first voltage signal V1. The first voltage signal V1 is corresponding to the maintained first current signal I1. Under this condition, the first voltage signal V1 generated by the voltage generating circuit 102 is the operation voltage of the photoelectric conversion unit 200.

How the first voltage signal V1 is adjusted from the first voltage level to the second voltage level is described below.

Figure 3:
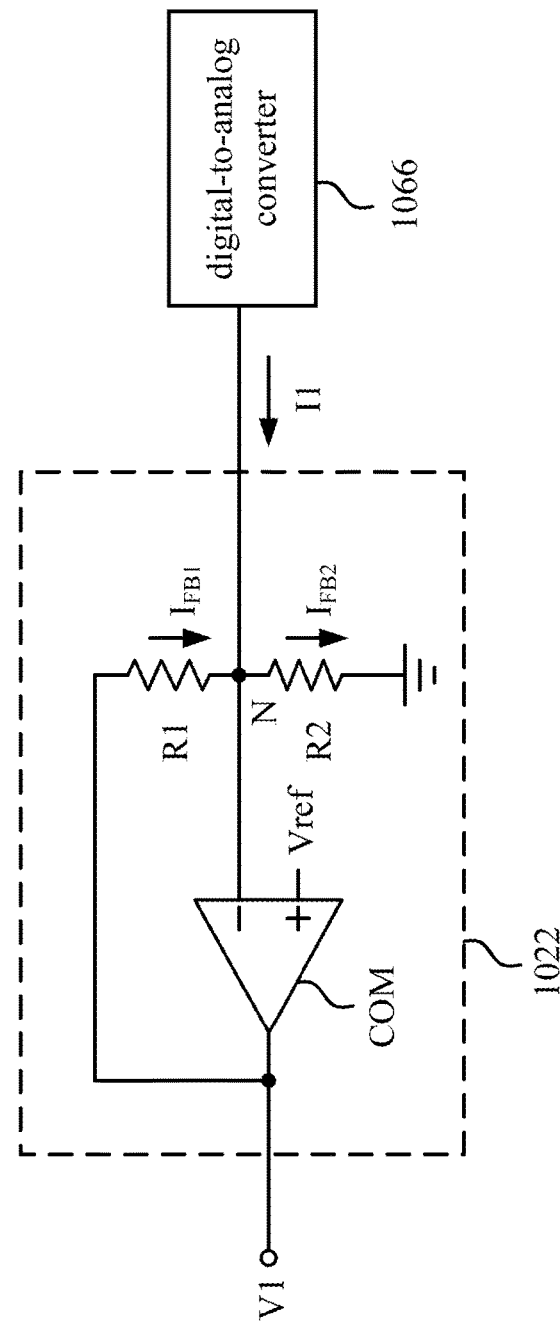
FIG. 3 is a schematic diagram illustrating a boost converter and a digital-to-analog converter according to some embodiments of the present disclosure.

FIG. 3 is a schematic diagram illustrating the boost converter 1022 and the digital-to-analog converter 1066 according to some embodiments of the present disclosure. As illustrated in FIG. 3, the boost converter 1022 includes a comparator COM, a first resistor R1, and a second resistor R2. A positive input terminal of the comparator COM is configured to receive a reference voltage Vref. A negative input terminal of the comparator COM is electrically connected to the first resistor R1 and the second resistor R2 at a node N. The negative input terminal of the comparator COM is configured to receive the first current signal I1 from the digital-to-analog converter 1066. An output terminal of the comparator COM is configured to output the first voltage signal V1. The output terminal of the comparator COM is electrically connected the node N through the first resistor R1.

With a feedback mechanism of the boost converter 1022, the voltage level of the first voltage signal V1 is negatively correlated to the first current signal I1. In other words, by reducing the first current signal I1, the voltage level of the first voltage signal V1 is adjusted from the first voltage level (low voltage level) to the second voltage level (high voltage level).

In detail, with the feedback mechanism of the boost converter 1022, a voltage level at the node N is equal to a voltage level of the reference voltage Vref. In other words, the voltage level at the node N is fixed when the voltage level of the reference voltage Vref is fixed. Since the voltage level at the node N is fixed, a current signal $I_{FB2}$ is a constant. Since the current signal $I_{FB2}$ is a sum of a current signal $I_{FB1}$ and the first current signal I1, the current signal $I_{FB1}$ increases when the current signal $I_{FB2}$ is the constant and the first current signal I1 decreases. Under this condition, the first voltage signal V1 is pulled up.

Figure 4:
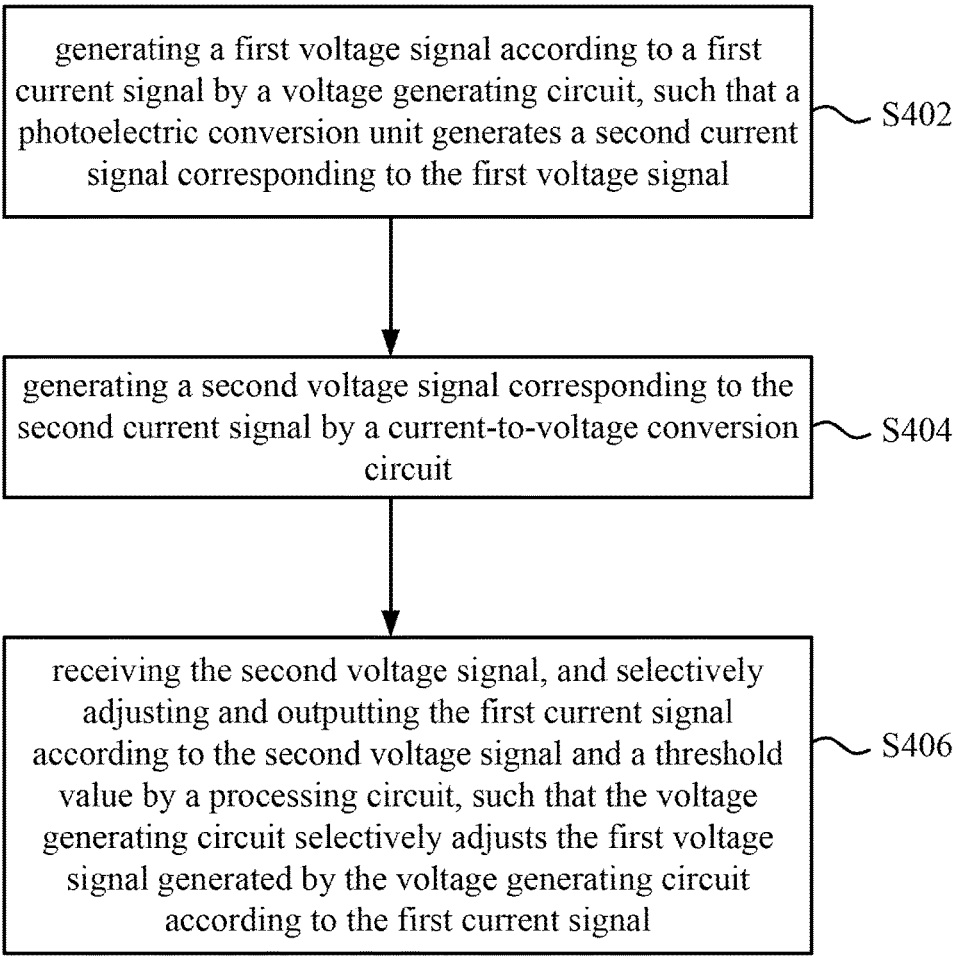
FIG. 4 is a flow diagram illustrating an operation voltage testing method according to some embodiments of the present disclosure.

FIG. 4 is a flow diagram illustrating an operation voltage testing method 400 according to some embodiments of the present disclosure. In some embodiments, the operation voltage testing method 400 may be applied to the operation voltage testing circuit 100 in FIG. 1.

As illustrated in FIG. 1, in the step S402, the voltage generating circuit 102 is configured to generate the first voltage signal V1 according to the first current signal I1, such that the photoelectric conversion unit 200 generates the second current signal I2 corresponding to the first voltage signal V1. In the step S404, the current-to-voltage conversion circuit 104 is configured to generate the second voltage signal V2 corresponding to the second current signal I2. In the step S406, the processing circuit 106 is configured to receive the second voltage signal V2, and selectively adjust and output the first current signal I1 according to the second voltage signal V2 and the threshold value TS, such that the voltage generating circuit 102 selectively adjusts the first voltage signal V1 generated by the voltage generating circuit 102 according to the first current signal I1. The detail operations about the operation voltage testing method 400 have been described in the aforementioned embodiments, so not be described again herein.

As the above embodiments, the operation voltage testing circuit of the present disclosure adjusts the first voltage signal as the operation voltage of the photoelectric conversion unit by the processing circuit, such that the operation voltage of the photoelectric conversion unit is found out effectively and rapidly.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An operation voltage testing circuit, comprising:
   a voltage generating circuit configured to generate a first voltage signal with a first voltage level according to a first current signal, such that a photoelectric conversion unit generates a second current signal corresponding to the first voltage signal;
   a current-to-voltage conversion circuit configuration to generate a second voltage signal corresponding to the second current signal; and
   a processing circuit configured to receive the second voltage signal, and to selectively adjust and output the first current signal according to the second voltage signal and a threshold value, such that the voltage generating circuit selectively adjusts the first voltage signal according to the first current signal;
   wherein the threshold value is corresponding to the second voltage signal generated by the current-to-voltage conversion circuit under a condition that the photoelectric conversion unit operates under an operation voltage;
   wherein a voltage level of the first voltage signal is negatively correlated to the first current signal;
   wherein the processing circuit is further configured to adjust and output the first current signal when the second current signal is smaller than a current signal outputted by the photoelectric conversion unit under the condition that the photoelectric conversion unit operates under the operation voltage, such that the voltage generating circuit generates the first voltage signal with a second voltage level, and the second voltage level is higher than the first voltage level.

2. The operation voltage testing circuit of claim 1, wherein the processing circuit comprises:
   an analog-to-digital converter configured to convert the second voltage signal to a digital signal;
   a processor configured to compare the digital signal with the threshold value to output a control signal; and
   a digital-to-analog converter configured to selectively adjust the first current signal according to the control signal.

3. The operation voltage testing circuit of claim 2, wherein the digital-to-analog converter is configured to adjust the first current signal when the digital signal is unsatisfied to the threshold value, such that the voltage generating circuit generates the first voltage signal with second voltage level according to the adjusted first current signal.

4. The operation voltage testing circuit of claim 2, wherein the digital-to-analog converter is configured to maintain the first current signal when the digital signal is satisfied with the threshold value.

5. The operation voltage testing circuit of claim 1, wherein the current-to-voltage conversion circuit comprises:
   a current measuring unit configured to generate a third current signal according to the second current signal; and a current-to-voltage conversion unit configured to convert the third current signal to the second voltage signal, wherein the third current signal is equal to or smaller than the second current signal.

6. The operation voltage testing circuit of claim 1, wherein the voltage generating circuit, the current-to-voltage conversion circuit, and the processing circuit are disposed in an integrated circuit.

7. The operation voltage testing circuit of claim 1, wherein the voltage generating circuit comprises a boost converter.

8. An operation voltage testing method, comprising: generating a first voltage signal according to a first current signal by a voltage generating circuit, such that a photoelectric conversion unit generates a second current signal corresponding to the first voltage signal;
generating a second voltage signal corresponding to the second current signal by a current-to-voltage conversion circuit; and
receiving the second voltage signal, and selectively adjusting and outputting the first current signal according to the second voltage signal and a threshold value by a processing circuit, such that the voltage generating circuit selectively adjusts the first voltage signal according to the first current signal;
wherein the threshold value is corresponding to the second voltage signal generated by the current-to-voltage conversion circuit under a condition that the photoelectric conversion unit operates under an operation voltage;
wherein a voltage level of the first voltage signal is negatively correlated to the first current signal;
wherein the processing circuit is further configured to adjust and output the first current signal when the second current signal is smaller than a current signal outputted by the photoelectric conversion unit under the condition that the photoelectric conversion unit operates under the operation voltage, such that the voltage generating circuit generates the first voltage signal with a second voltage level, and the second voltage level is higher than the first voltage level.

9. The operation voltage testing method of claim 8, wherein the processing circuit comprises an analog-to-digital converter, a processor, and a digital-to-analog converter, and the adjusting the first current signal comprises:
converting the second voltage signal to a digital signal by the analog-to-digital converter;
determining whether the digital signal is satisfied to the threshold value or not by the processor; and
adjusting the first current signal by the digital-to-analog converter when the digital signal is unsatisfied to the threshold value, such that the voltage generating circuit generates the first voltage signal with the second voltage level according to the adjusted first current signal.

10. The operation voltage testing method of claim 9, further comprising:
maintaining the first current signal by the digital-to-analog converter when the digital signal is satisfied to the threshold value.

11. An operation voltage testing circuit, comprising:
a processing circuit configured to generate a first current signal; and a voltage generating circuit configured to generate a first voltage signal with a first voltage level according to the first current signal, such that a photoelectric conversion unit generates a second current signal corresponding to the first voltage signal,
wherein the processing circuit is further configured to adjust and output the first current signal when the second current signal is smaller than a current signal outputted by the photoelectric conversion unit under a condition that the photoelectric conversion unit operates under an operation voltage, such that the voltage generating circuit generates the first voltage signal with a second voltage level, and the second voltage level is higher than the first voltage level;
wherein a voltage level of the first voltage signal is negatively correlated to the first current signal.

12. The operation voltage testing circuit of claim 11, wherein the processing circuit is configured to maintain the first current signal when the second current signal is equal to the current signal outputted by the photoelectric conversion unit under the condition that the photoelectric conversion unit operates under the operation voltage.

13. The operation voltage testing circuit of claim 11, further comprising:
a current-to-voltage conversion circuit configured to generate a second voltage signal corresponding to the second current signal,
wherein the processing circuit is configured to convert the second voltage signal to a digital signal and compare the digital signal with a threshold value, to selectively adjust and output the first current signal; and
wherein the threshold value is corresponding to the second voltage signal generated by the current-to-voltage conversion circuit under the condition that the photoelectric conversion unit operates under the operation voltage.

14. The operation voltage testing circuit of claim 13, wherein the current-to voltage conversion circuit comprises:
a current measuring unit configured to generate a third current signal according to the second current signal; and
a current-to-voltage conversion unit configured to convert the third current signal to the second voltage signal, wherein the third current signal is equal to or smaller than the second current signal.

15. The operation voltage testing circuit of claim 13, wherein the processing circuit comprises:
an analog-to-digital converter configured to convert the second voltage signal to the digital signal;
a processor configured to compare the digital signal with the threshold value to output a control signal; and
a digital-to-analog converter configured to selectively adjust the first current signal according to the control signal.

16. The operation voltage testing circuit of claim 11, wherein the processing circuit and the voltage generating circuit are disposed in an integrated circuit.

17. The operation voltage testing circuit of claim 11, wherein the photoelectric conversion unit comprises an avalanche photodiode.

* * * * *